(12) United States Patent
Wei et al.

(10) Patent No.: US 11,778,932 B2
(45) Date of Patent: Oct. 3, 2023

(54) RESISTIVE RANDOM ACCESS MEMORY AND MANUFACTURING METHOD THEREOF

(71) Applicant: Winbond Electronics Corp., Taichung (TW)

(72) Inventors: Cheng-Hong Wei, Taichung (TW); Chien-Hsiang Yu, Taichung (TW); Hung-Sheng Chen, Taichung (TW)

(73) Assignee: WINBOND ELECTRONICS CORP., Taichung (TW)

( * ) Notice: Subject to any disclaimer, the term of this patent is extended or adjusted under 35 U.S.C. 154(b) by 333 days.

(21) Appl. No.: 17/100,342

(22) Filed: Nov. 20, 2020

(65) Prior Publication Data
US 2021/0159406 A1 May 27, 2021

(30) Foreign Application Priority Data
Nov. 22, 2019 (TW) ................................. 108142465

(51) Int. Cl.
| H01L 45/00 | (2006.01) |
| H10N 70/00 | (2023.01) |
| H10B 63/00 | (2023.01) |

(52) U.S. Cl.
CPC .......... *H10N 70/841* (2023.02); *H10B 63/00* (2023.02); *H10N 70/021* (2023.02); *H10N 70/063* (2023.02)

(58) Field of Classification Search
CPC .................. H10N 70/823; H10N 70/8265
See application file for complete search history.

(56) References Cited

U.S. PATENT DOCUMENTS

| 7,791,925 B2 | 9/2010 | Li et al. | |
| 2021/0280638 A1* | 9/2021 | Li | ........................ H10N 70/24 |

* cited by examiner

*Primary Examiner* — Mark V Prenty
(74) *Attorney, Agent, or Firm* — Muncy, Geissler, Olds & Lowe, P.C.

(57) ABSTRACT

A RRAM and its manufacturing method are provided. The RRAM includes a first dielectric layer formed on a substrate, and two memory cells. The two memory cells include two bottom electrode structures separated from each other. Each bottom electrode structure fills one of two trenches in the first dielectric layer. The two memory cells also include a resistance switching layer and a top electrode structure. The resistance switching layer is conformity formed on the surface of an opening in the first dielectric layer, and the opening is between the two trenches. The top electrode structure is on the resistance switching layer and fills the opening. A top surface of the first dielectric layer, top surfaces of the bottom electrode structures, a top surface of the resistance switching layer, and a top surface of the top electrode structure are coplanar.

10 Claims, 6 Drawing Sheets

RESISTIVE RANDOM ACCESS MEMORY AND MANUFACTURING METHOD THEREOF

CROSS REFERENCE TO RELATED APPLICATIONS

This application claims priority of Taiwan Patent Application No. 108142465, filed on Nov. 22, 2019, the entirety of which is incorporated by reference herein.

BACKGROUND OF THE INVENTION

Field of the Invention

The present disclosure relates to a memory device, and in particular, it relates to a resistive random access memory and a method for manufacturing the resistive random access memory.

Description of the Related Art

Resistive random access memory (RRAM) has the following advantages: a simple structure, small area, small operating voltage, fast operating speed, long memory time, multi-state memory, and low power consumption. Therefore, the RRAM has great potential to replace the current flash memory and become a mainstream form of non-volatile memory for the next generation.

In a conventional RRAM, a method of forming a memory cell generally, includes the following steps: sequentially depositing a bottom electrode material layer, a resistance switching material layer, and a top electrode material layer. Then, a patterning process is performed by a dry etching process (for example, plasma etching) to define a plurality of memory cells. Each of the memory cells includes a vertically stacked structure formed by a bottom electrode layer, a resistance switching layer, and a top electrode layer.

However, the above-mentioned dry etching process may cause damage to the resistance switching layer. For example, ions generated during the plasma etching process may bombard the sidewalls of the bottom electrode layer, the resistance switching layer, or the top electrode layer, and may cause damage to parts of the bottom electrode layer, the resistance switching layer, or the top electrode layer. If the resistance switching layer is damaged, a conductive path cannot be formed in the damaged region. As a result, the electrical resistance value of the RRAM in a low-resistance state becomes high, thereby the operation of the RRAM may fail. Furthermore, because the position, area, and depth of these damaged regions cannot be controlled, the electrical resistance values of these memory cells in the low-resistance state have uncontrollable variations. As a result, the reliability and yield of the RRAM will be significantly reduced. In addition, as the critical dimension of the memory cell becomes smaller, the influences of the damaged region become greater. Therefore, with the miniaturization of memory devices, the above-mentioned problems will become more serious.

For the memory industry, in order to improve the reliability and yield of RRAM further, there is a need to improve the RRAM and the manufacturing process thereof.

BRIEF SUMMARY OF THE INVENTION

The disclosure provides a RRAM and a method for manufacturing the same. The manufacturing method of the RRAM can significantly improve the reliability and yield of the product, and is advantageous for the miniaturization of the memory device.

In accordance with some embodiments of the present disclosure, a RRAM is provided. The RRAM includes a first dielectric layer formed on a substrate and two memory cells. The two memory cells include two bottom electrode structures, a resistance switching layer, and a top electrode structure. The two bottom electrode structures are separated from each other and fill two trenches located in the first dielectric layer. The resistance switching layer is conformally formed on a surface of an opening located in the first dielectric layer. The opening is located between the two trenches. The top electrode structure is located on the resistance switching layer and fills the opening. A top surface of the first dielectric layer, top surfaces of the bottom electrode structures, a top surface of the resistance switching layer, and a top surface of the top electrode structure are substantially coplanar.

In accordance with some embodiments of the present disclosure, a method for manufacturing a RRAM is provided. The method includes forming a first dielectric layer on a substrate and forming two memory cells. Forming two memory cells includes forming two trenches in the first dielectric layer. Forming two memory cells also includes forming two bottom electrode structures separated from each other and filling the two trenches located in the first dielectric layer. Forming two memory cells includes forming an opening between the two trenches. Forming two memory cells includes conformally forming a resistance switching layer on a surface of the opening. Forming two memory cells includes forming a top electrode structure on the resistance switching layer and filling the opening; and. Forming two memory cells includes performing a planarization process to make a top surface of the first dielectric layer, top surfaces of the bottom electrode structures, a top surface of the resistance switching layer, and a top surface of the top electrode structure be coplanar.

In the manufacturing method of the RRAM provided by the embodiments of the present invention, a dry etching process is not performed on the resistance switching layer. Therefore, damage to the resistance switching layer can be significantly reduced. As a result, the reliability and yield of the RRAM can be significantly improved. Furthermore, in the RRAM provided by the embodiments of the present invention, the bottom electrode, the resistance switching layer, and the top electrode are arranged horizontally, and two memory cells separated from each other share the same top electrode. Therefore, the density of the memory cells can be significantly increased. As a result, it is advantageous for the miniaturization of the RRAM.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1A:
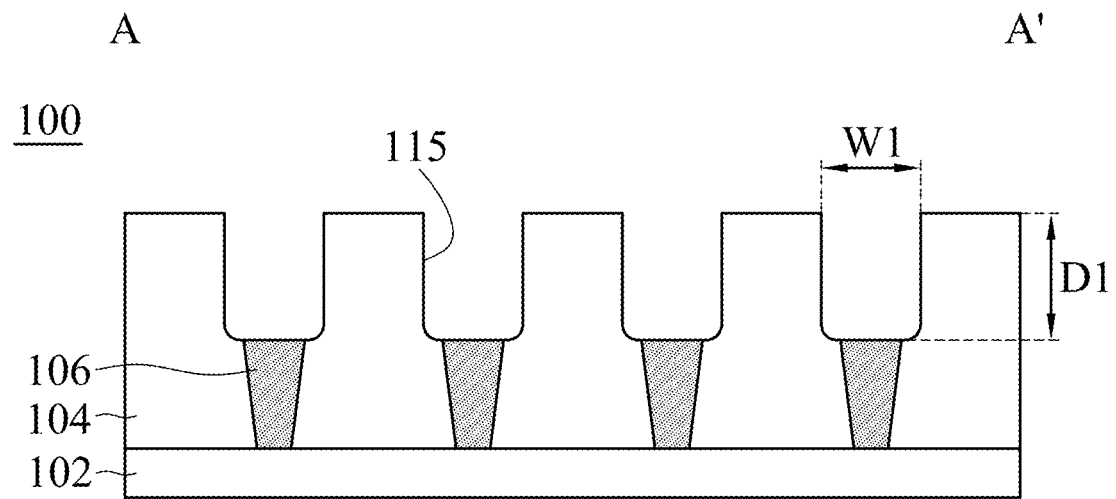
FIGS. 1A-1E are cross-sectional views corresponding to various steps of manufacturing a RRAM in accordance with some embodiments.

The present disclosure is made for the purpose of illustrating the general principles of the invention and should not be taken in a limiting sense. The scope of the invention is best determined by reference to the appended claims. The present disclosure is best understood from the following detailed description when read with the accompanying figures. It should be noted that, in accordance with the standard practice in the industry, various features are not drawn to scale. In fact, the relative dimensions of the various features may be arbitrarily increased or reduced for clarity of discussion. In addition, the present disclosure may repeat reference numerals and/or letters in the various examples. This repetition is for the purpose of simplicity and clarity and does not in itself dictate a relationship between the various embodiments and/or configurations discussed.

FIGS. 1A-1E are cross-sectional views corresponding to various steps of manufacturing a. RRAM 100 in accordance with some embodiments. Referring to FIG. 1A, a first dielectric layer 104 is formed on a substrate 102. The substrate 102 may include a bulk semiconductor substrate (for example, a silicon substrate), a compound semiconductor substrate (for example, a IIIA-VA group semiconductor substrate), a silicon on insulator (SOD) substrate, and so on. The substrate 102 may be a doped or an undoped semiconductor substrate. In some embodiments, the substrate 102 is a silicon substrate. The first dielectric layer 104 may be suitable dielectric material, such as nitride, oxide, or oxynitride, in some embodiments, the first dielectric layer 104 is silicon oxide.

Then, a plurality of bottom electrode contact structures 106 are formed in the first dielectric layer 104. More specifically, the first dielectric layer 104 may be patterned by using a mask layer (not shown), and a plurality of contact holes are formed in the first dielectric layer 104. Then, a conductive material is filled into the contact holes, and excess conductive material on the first dielectric layer 104 is removed by a planarization process (for example, a chemical mechanical polishing process (CMP)) to form the bottom electrode contact structures 106 in the first dielectric layer 104. In some embodiments, the bottom electrode contact structure 106 is a single-layer structure formed of a conductive layer, and the conductive layer includes tungsten, aluminum, copper, other suitable metals, or a combination thereof. In other embodiments, the bottom electrode contact structure 106 is a dual-layer structure including a liner and a conductive layer disposed on the liner. The liner can improve the adhesion between the conductive layer and the substrate 102, and can prevent metal atoms from diffusing into the substrate 102. The material of the liner may include titanium, titanium nitride, tungsten nitride, tantalum, tantalum nitride, another suitable conductive material, or a combination thereof. The material of the conductive layer may include tungsten, aluminum, copper, another suitable metal, or a combination thereof.

After the bottom electrode contact structures 106 are formed, the first dielectric layer 104 is formed again to cover the bottom electrode contact structures 106. Then, a plurality of trenches 115 are formed in the first dielectric layer 104. In the top-view (for example, FIG. 2 or FIG. 3), a plurality of trenches 115 parallel to each other and extend in a first direction, and the trenches 115 is filled during subsequent steps to form the bottom electrode structures 112. In other words, the positions of the trenches 115 correspond to the positions of the bottom electrode structures 112. As shown in FIG. 1A, the trench 115 is formed directly on the bottom electrode contact structure 106, and the top surface of the bottom electrode contact structure 106 is exposed by the trenches 115. The trenches 115 may be formed by performing a suitable dry etching process.

Figure 1B:
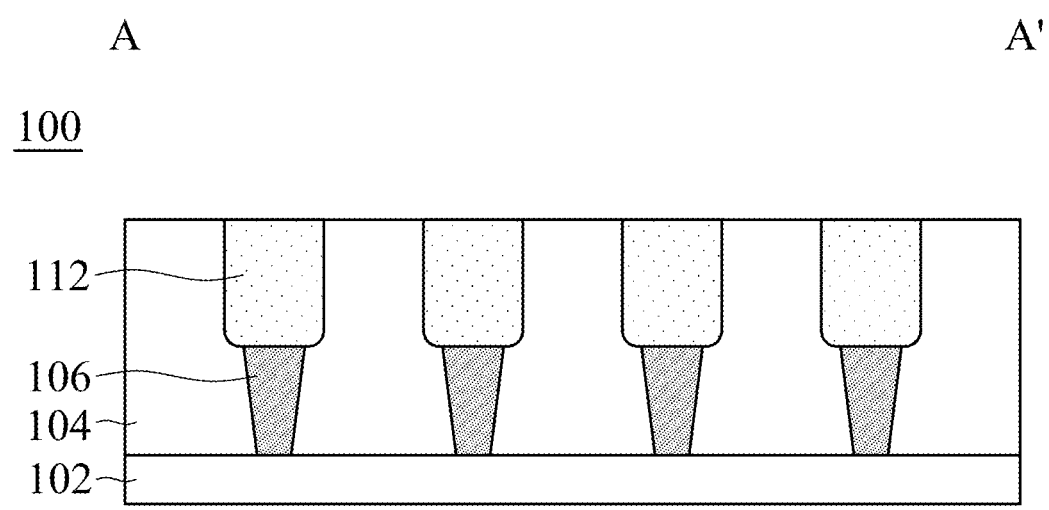

Referring to FIG. 1B, a plurality of bottom electrode structures 112 are separated from one another. Each of the bottom electrode structures 112 is formed in one of the plurality of trenches 115 and fills the trench 115. The bottom electrode structures 112 may be electrically connected to other elements (not shown) in the substrate 102 through the bottom electrode contact structures 106.

Figure 1C:
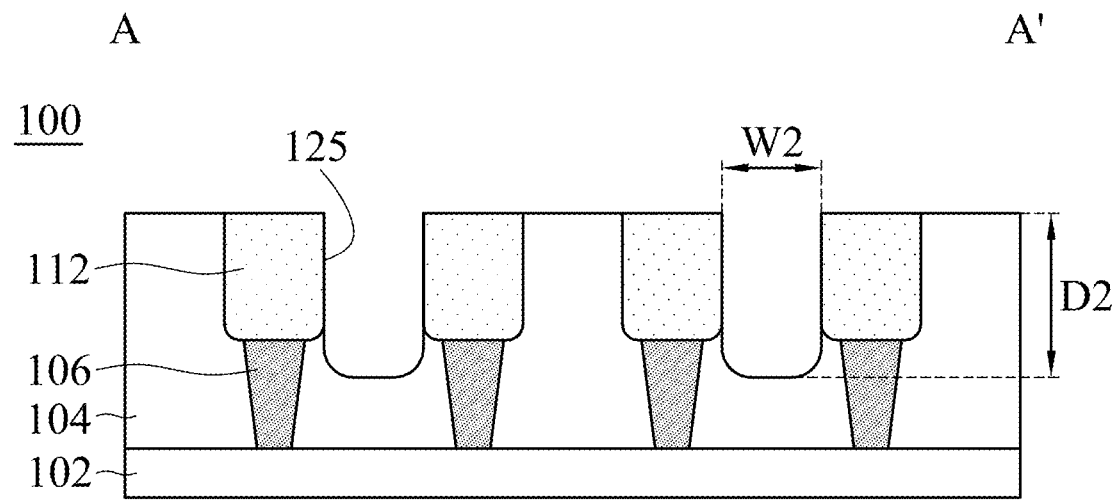

Referring to FIG. 1C, a plurality of openings 125 are formed in the first dielectric layer 104, and each of the openings 125 is located between two trenches 115. In the top-view (for example, FIG. 2 or FIG. 3), there are a plurality of openings 125 between two trenches 115, and these openings 125 are arranged along the first direction. The opening 125 is filled in subsequent steps to form a resistance switching layer 114 and a top electrode structure 116. In other words, the positions of the openings 125 correspond to the positions of the resistance switching layer 114 and the positions of the top electrode structures 116. The process of forming the openings 125 may be the same as or similar to the process of forming trenches 115.

Figure 1D:
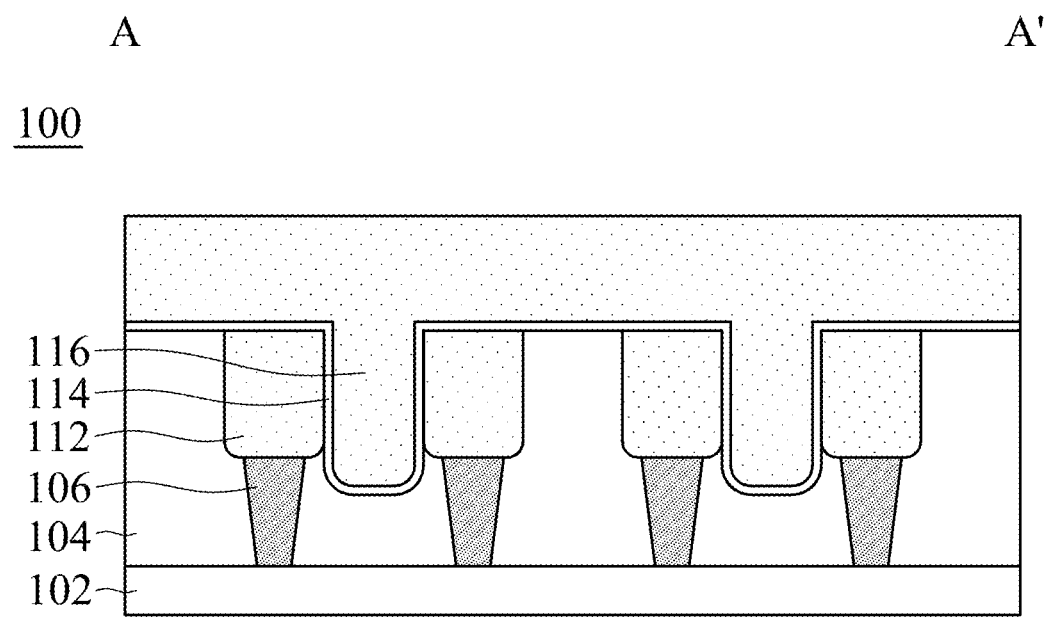

Referring to FIG. 1D, a resistance switching layer 114 is conformally formed on the inner surfaces of the openings 125 and covers the bottom electrode structures 112 and the first dielectric layer 104. Then, top electrode structures 116 are formed on the resistance switching layer 114 and filled into the openings 125.

The resistance switching layer 114 may be switched to a different electrical resistance state by applying a voltage to the bottom electrode structure 112 and the top electrode structure 116. The material of the bottom electrode structure 112 and the material of the top electrode structure 116 may each independently includes titanium, tantalum, titanium nitride, tantalum nitride, other suitable conductive materials, or a combination thereof. The bottom electrode structure 112 and the top electrode structure 116 may each independently be a single layer structure formed of a single material or a multilayer structure formed of a plurality of different materials. In some embodiments, the bottom electrode structure 112 is a single layer structure formed of titanium nitride, and the top electrode layer 116 is a single layer structure formed of titanium. The bottom electrode structure 112 and the top electrode structure 116 may be independently formed by using a physical vapor deposition process, a chemical vapor deposition process, or another suitable deposition process.

When a forming voltage or a writing voltage is applied to the RRAM, conductive filaments may be formed in the resistance switching layer 114. Therefore, the resistance switching layer 114 is switched from a high-resistance state to a low-resistance state. In some embodiments, the conductive filament is formed by the equivalent positively, charged oxygen vacancies. In other embodiments, the conductive filament is formed by the metal ions generated from the top electrode structure 116 or the bottom electrode structure 112. When an erasing voltage is applied, the aforementioned filaments disappear. Therefore, the resistance switching layer 114 is switched from the low-resistance state to the high-resistance state. The material of the resistance switching layer 114 may be, for example, metal oxides, such as the oxide of aluminum (Al), hafnium (Hi), chromium (Cr), copper (Cu), titanium (Ti), cobalt (Co), zinc (Zn), manganese (Mn), molybdenum (Mo), niobium (Nb), iron (Fe), nickel (Ni), tungsten (W), lead (Pb), tantalum (Ta), lanthanum (La), or zirconium (Zr), binary metal oxides, such as strontium titanate ($SrTiO_3$, STO), strontium zirconate ($SrZrO_3$) ternary metal oxides, such as praseodymium calcium manganese oxide ($PrCaMnO_3$, PCMO); combinations thereof or other suitable resistance switching materials. In some embodiments, the material of the resistance switching layer 114 may be hafnium oxide. The resistance switching layer 114 may be formed by using a suitable process, for example, an atomic layer deposition process, a sputtering process, a resistance heating evaporation process, an electron beam evaporation process, or other suitable deposition processes. In some embodiments, the resistance switching layer 114 is formed by using the radio frequency magnetron sputtering. In some embodiments, the thickness of the resistance switching layer 114 is 1-100 nm.

Figure 1E:
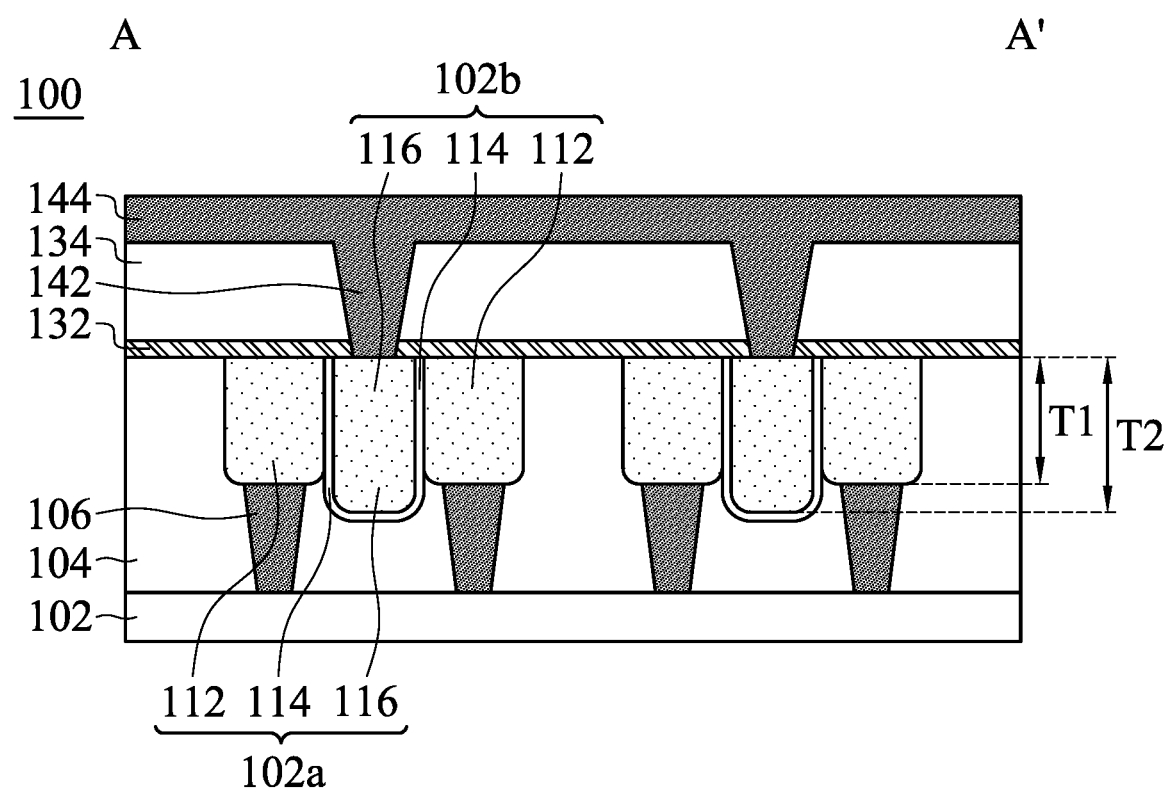

Referring to FIG. 1E, after the top electrode structures 116 are formed, a planarization process (for example, a CMP) is performed to make the top surface of the first dielectric layer 104, the top surfaces of the bottom electrode structures 112, the top surfaces of the ends of the resistance switching layers 114, and the top surfaces of the top electrode structures 116 substantially coplanar. After the planarization process, the cross-section of the resistance switching layer 114 is U-like shape, which has two ends with top surfaces substantially coplanar with the top surfaces of the top electrode structures 116. Then, a protective layer 132 is formed on the first dielectric layer 104. The protective layer 132 may be a single layer structure formed of a single material or a multilayer structure formed, of a plurality of different materials. In some embodiments, the protective layer 132 is a dual-layer structure formed by a hydrogen barrier layer and a spacer layer formed on the hydrogen barrier layer. The hydrogen harrier layer can prevent hydrogen from entering the substrate 102, thereby avoiding degradation or failure of the RRAM. The material of the hydrogen barrier layer may be a metal oxide (such as aluminum oxide), a metal nitride, a metal oxynitride, or a combination thereof. The spacer layer can reduce or prevent damage to the memory cell 110 during subsequent processes. The material of the spacer layer may be a nitride or an oxynitride. In some embodiments, the protective layer 132 is a single layer structure formed of silicon nitride.

Then, a second dielectric layer 134 is formed on the protective layer 132 to cover the bottom electrode structures 112, the resistance switching layers 114, and the top electrode structures 116. The material of the second dielectric layer 134 may be the same as or similar to the material of the first dielectric layer 104. Then, top electrode contact structures 142 are formed in the second dielectric layer 134 and located on the top electrode structures 116 for being electrically connected to the top electrode structures 116, respectively. The processes and material for forming the top electrode contact structure 142 may be the same as or similar to the material of the processes and material for forming the bottom electrode contact structure 106. After the top electrode contact structures 142 are formed, a conductive material is deposited on the second dielectric layer 134 and patterned to form a conductive line 144. The conductive line 144 is formed on the top electrode contact structures 142 and electrically connected to the top electrode contact structures 142. The material of the conductive line 144 may be the metal with good conductivity, for example, copper, aluminum, silver, or tungsten. Therefore, the operating speed of the memory cell 110 can be increased. Afterwards, other conventional processes can be performed to complete the RRAM 100, and these conventional processes will not be described in detail herein.

In the manufacturing method of the RRAM 100 provided in the present embodiment, a dry etching process is not performed on the resistance switching layer Therefore, damage to the resistance switching layer can be significantly reduced. As a result, the reliability and yield of the RRAM can be significantly improved.

More specifically, when the trench 115 or the opening 125 is formed by a dry etching process, the resistance switching layer 114 has not been formed yet. Therefore, the resistance switching layer 114 is not damaged by the dry etching process. Furthermore, as shown in FIG. 1D, the resistance switching layer 114 is conformally formed in the opening 125, and the pattern (i.e., the pattern viewed from the top view) of the resistance switching layer 114 does not need to be defined by a dry etching process. In other words, the dry etching is not performed on all surfaces of the resistance switching layer 114. Therefore, an uncontrollable damaged region can be prevented from being generated in the resistance switching layer 114.

Figure 2:
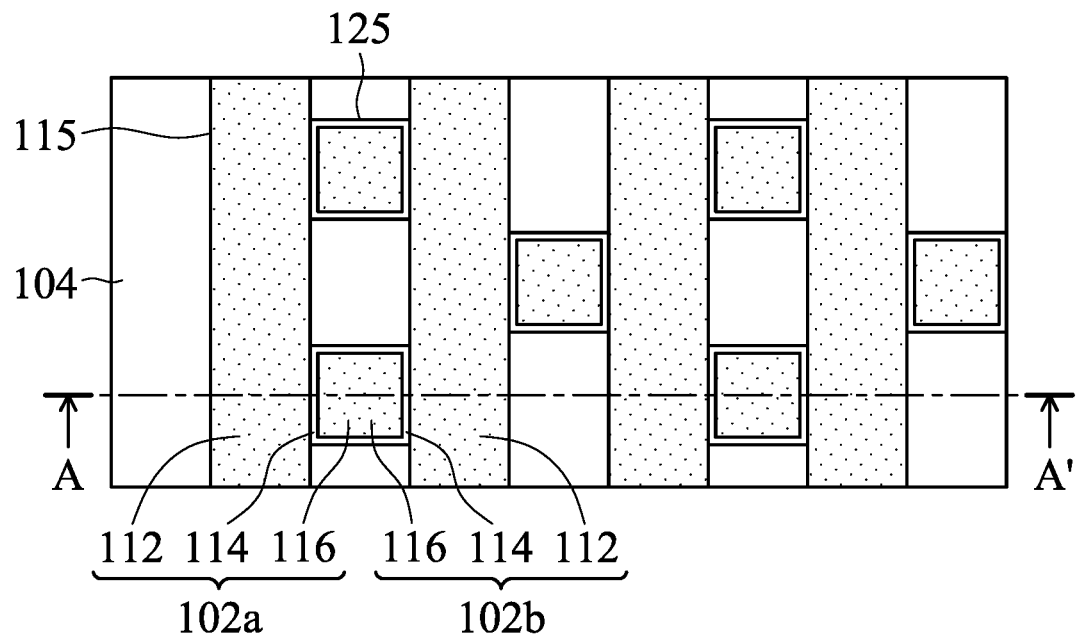
FIG. 2 is a top-view of a RRAM in accordance with some embodiments.
Figure 3:
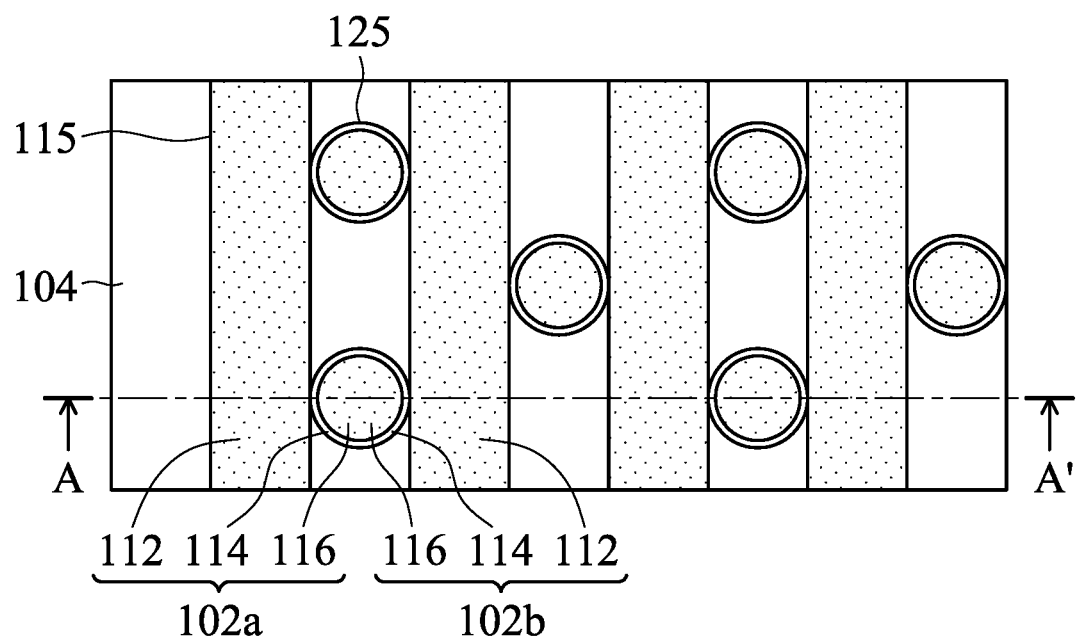
FIG. 3 is a top-view of a RRAM in accordance with other embodiments.

Furthermore, in the present embodiment, the pattern (i.e., the pattern viewed from the top view, as shown in FIG. 2 or FIG. 3) of the resistance switching layer 114 can be defined by removing the resistance switching layer 114 by a CMP. It should be understood that during the dry etching process, the ions having high energy may enter the deep regions in the resistance switching layer 114. Because the depth of the damaged region depends on the energy of the ions, the position, area, and depth of the damaged region cannot be controlled. On the other hand, if the damage is caused by the CMP, it is difficult for the abrasive particles to enter the deep region in the resistance switching layer 114. Therefore, even if the resistance switching layer 114 is damaged by the CMP, this damage will only occur in regions close to the surface of the resistance switching layer 114. In other words, compared to the dry etching process, the degree of damage caused by the CMP to the surface of the resistance switching layer 114 is slight.

Referring to FIG. 1E, in some embodiments, a RRAM 100 is provided. The RRAM 100 includes a first dielectric layer 104 and two memory cells 102a and 102b formed on a substrate 102. The memory cells 102a and 102b include two bottom electrode structures 112 that are separated from each other, a resistance switching layer 114, and a top electrode structure 116. Each of two bottom electrode structures 112 fills one of two trenches 115 (shown in FIG. 1A) in the dielectric layer 104. The resistance switching layer 114 is conformally formed on the surface of the opening 125 (shown in FIG. 1C) in the first dielectric layer 104, and the opening 125 is located between the two bottom electrode structures 112. The top electrode structure 116 is located on the resistance switching layer 114 and fills the opening 125. The RRAM 100 also includes a protective layer 132, a second dielectric layer 134, two bottom electrode contact structures 106, two top electrode contact structures 142, and a conductive line 144. The protective layer 132 is located between the first dielectric layer 104 and the second dielectric layer 134. The second dielectric layer 134 covers the bottom electrode structure 112, the resistance switching layer 114, and the top electrode structure 116. Two bottom electrode contact structures 106 are located in the first dielectric layer 104. Each of the bottom electrode contact structures 106 is located between the substrate 102 and a corresponding bottom electrode structure 112, and each bottom electrode contact structure 106 is electrically connected to a corresponding bottom electrode structure 112. The top electrode contact structure 142 is located in the second dielectric layer 134 and directly on the top electrode structure 116. The top electrode contact structure 142 is electrically connected to the top electrode structure 116. The conductive line 144 is located on the second dielectric layer 134 and is electrically connected to the top electrode contact structure 142.

Referring to FIG. 1E, along a second direction parallel to the substrate surface (for example, from the left side to the right side in FIG. 1E), the memory cell 102a has the bottom electrode structure 112, the resistance switching layer 114, and the top electrode structure 116 sequentially, and the memory cell 102b has the top electrode structure 116, the resistance switching layer 114, and the bottom electrode structure 112 sequentially. In other words, two independent memory cells 102a and 102h share the same top electrode structure 116, and the resistance switching layer 114 of the memory cell 102a and the resistance switching layer 114 of the memory cell 102b are connected to each other. In other words, the memory cells 102a and 102b are horizontal memory cells, instead of the conventional vertical memory cells (i.e., the bottom electrode layer, the resistance switching layer, and the top electrode layer stacked from bottom to top). Because the memory cells 102a and 102h are horizontal memory cells, the positions, shapes, and sizes of the memory cells 102a and 102b can be defined by forming the trenches 115 or the openings 125 in the first dielectric layer 104. As a result, it is not required to perform a dry etching process to the resistance switching layer 114. Therefore, the damage to the resistance switching layer 114 can be significantly reduced, and the reliability and yield of the RRAM can be significantly improved.

Referring to FIG. 1E, the resistance switching layer 114 has a U-shaped cross-sectional profile, and the cross-sectional profile includes two vertical portions and a horizontal portion connected to each other. In general, most conductive paths are formed in the overlapping region of the resistance switching layer, the bottom electrode, and the top electrode. Therefore, when a voltage is applied to the memory cell 102a, the conductive paths are formed in the vertical portion on the left side of the resistance switching layer 114. On the other hand, when a voltage is applied to the memory cell 102b, the conductive paths are formed in the vertical portion on the right side of the resistance switching layer 114. In addition, in one embodiment, the depth of the opening 125 is greater than the depth of the trench 115. As far as the horizontal portion of the resistance switching layer 114 located at the bottom of the opening 125 is concerned, the bottom electrode structure 112 cannot form an orthographic projection on the horizontal portion of the resistance switching layer 114, As a result, no conductive path is formed in the horizontal portion of the resistance switching layer 114. Therefore, even if the resistance switching layer 114 of the memory cell 102a and the resistance switching layer 114 of the memory cell 102h are connected to each other, the memory cell 102a and the memory cell 102b can be prevented from interfering with each other. As a result, the reliability of the product can be further improved. In order to achieve this purpose, the bottom surface of the bottom electrode structure 112 may be higher than or level with the bottom surface of the top electrode structure 116. In some embodiments, bottom electrode structure 112 has a first thickness T1, top electrode structure 116 has a second thickness T2, and the second thickness T2 is greater than the first thickness T1, as shown in FIG. 1E.

In order to make the bottom surface of the bottom electrode structure 112 higher than or level with the bottom surface of the top electrode structure 116 and reduce the time and cost required to etch and fill the opening 125, the ratio of the depth of the opening 125 relative to the depth of the trench 115 may be controlled within an appropriate range. Referring to FIG. 1A and FIG. 1C, the trench 115 has a first depth the opening 125 has a second depth D2, and the second depth D2 is greater than the first depth D1. In some embodiments, the ratio D2/D1 of the second depth D2 to the first depth D1 is 1.1-2.0. In other embodiments, the ratio D2/D1 of the second depth D2 to the first depth D1 is 1.2-1.8.

In general, in order to improve the efficiency of the memory cell, an effective region (i.e., the overlapping region of the orthographic projection of the top electrode on the resistance switching layer and the orthographic projection of the bottom electrode on the resistance switching layer) which is capable of forming the conductive paths in the resistance switching layer is increased. For a conventional vertical memory cell, in order to increase the effective region which is capable of forming the conductive paths, the area occupied by the memory cell on a substrate needs to be increased. This will reduce the usable area of the substrate and the element density, which is not disadvantageous for the miniaturization of the memory device. In contrast, for the RRAM 100 provided in the present embodiment, as long as the depth of the trench 115 and the depth of the opening 125 are increased, the effective region which is capable of forming the conductive paths in the resistance switching layer 114 can be increased, Therefore, the usable area of the substrate and the element density are not reduced, which is advantageous for the miniaturization of the memory device.

In addition, in the present embodiment, the bottom electrode structure 112 is formed in the trench 115, and the resistance switching layer 114 and the top electrode structure 116 are formed in the opening 125. Compared with the case where the bottom electrode structure 112, the resistance switching layer 114, and the top electrode structure 116 are all formed in the same trench (or opening), the difficulty of filling the trench (or opening) can be reduced. In other words, even if the trench 115 or the opening 125 have a high aspect ratio, the voids formed in the bottom electrode structure 112 or the top electrode structure 116 can be reduced or avoided. Therefore, the RRAM 100 provided in the present embodiment can further improve the yield of the memory device.

In order to facilitate the miniaturization of the RRAM and reduce the difficulty of filling the trench 115 and the opening 125, the aspect ratio of the trench 115 and the opening 125 can be controlled within an appropriate range. Referring to FIG. 1A and FIG. 1C, the trench 115 has a first depth D1, and a first width W1, and the opening 125 has a second depth D2 and a second width W2. In some embodiments, the ratio D1/W1 of the first depth D1 to the first width W1 is 1-10, and the ratio D2/W2 of the second depth D2 to the second width W2 is 2-20. In other embodiments, the ratio D1/W1 of the first depth D1 to the first width W1 is 3-6, and the ratio D2/W2 of the second depth D2 to the second width W2 is 6-12.

In addition, in the conventional vertical memory cell, the thickness of the bottom electrode layer and the thickness of the top electrode layer are very thin. Therefore, the conductive material (for example, copper) which is used to form the bottom electrode contact structure (or the top electrode contact structure) may penetrate the bottom electrode layer (or the top electrode layer) and diffuse into the resistance switching layer, thereby reducing the performance and yield of the memory device. Referring to FIG. 1E, in the present embodiment, the orthographic projection of the top electrode contact structure 142 on the top surface of the substrate 102 and the orthographic projection of each of the bottom electrode contact structures 106 on the top surface of the substrate 102 do not overlap. According to FIG. 1E, it can be understood that compared to the conventional vertical memory cell, in the present embodiment, the distance between the bottom electrode contact structure 106 (or the top electrode contact structure 142) and the effective region in the resistance switching layer 114 becomes longer. Therefore, the conductive material which is used to form the bottom electrode contact structure 106 (or the top electrode contact structure 142) can be significantly prevented from diffusing into the resistance switching layer, thereby improving the efficiency and yield of the memory device.

FIG. 2 is the top-view of the RRAM 100 of FIG. 1A to FIG. 1E, and FIG. 1A to FIG. 1E are cross-sectional views taken along line A-A' of FIG. 2. Referring to FIG. 2, in the top-view, the top electrode structure 116 is rectangular. Each of the top electrode structures 116 is located between two bottom electrode structures 112 which are separated from each other. In other words, in the present embodiment, two independent memory cells 102a and 102b share the same top electrode structure 116. Therefore, compared with the case where each of the memory cells has one top electrode, the density of the memory cell can be significantly increased. As a result, the miniaturization of the RRAM can be further facilitated. It can be understood that the number and shape of the memory cells shown in FIG. 2 are for illustration only, and are not intended to limit the present invention. For example, in some embodiments, in the top view, the top electrode structure 116 is circular, as shown in FIG. 3. In other embodiments, the top electrode structure 116 may have other shapes in the top view.

Figure 4:
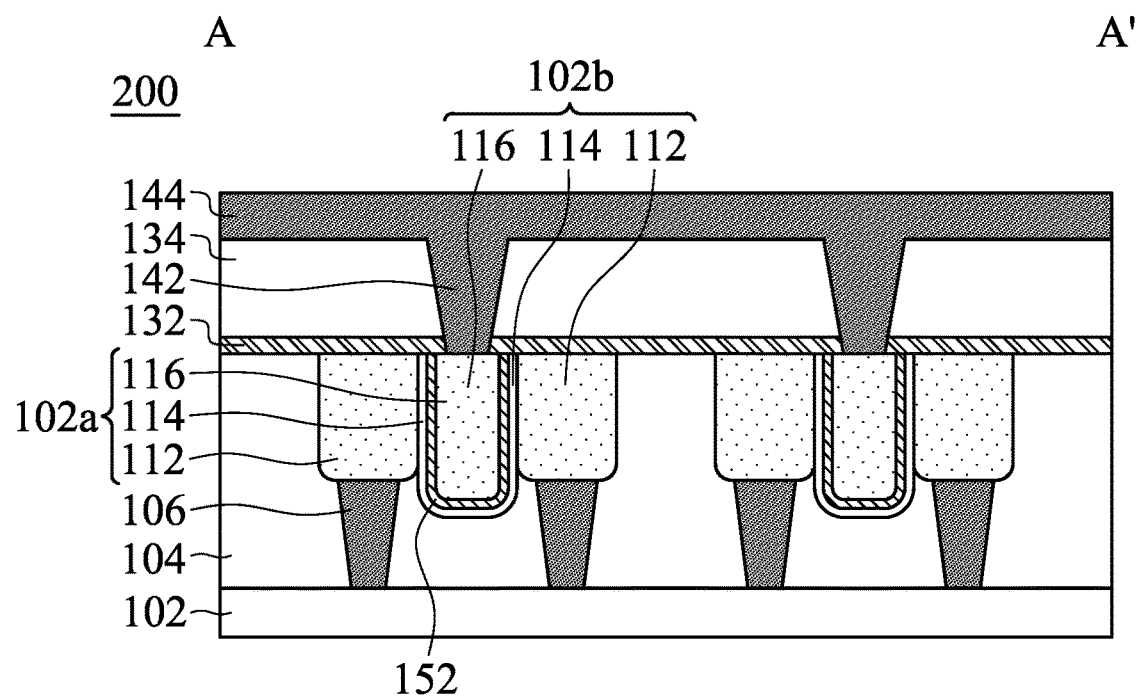
FIG. 4 is a cross-sectional view of a RRAM in accordance with some embodiments.

FIG. 4 is a cross-sectional view of a RRAM 200 in accordance with some embodiments. The RRAM 200 shown in FIG. 4 is similar to the RRAM 100 shown in FIG. 1F, and the difference is that an additional function layer 152 is shown in FIG. 4. In order to simplify the description, the elements similar to those shown in FIG. 1E and the steps for forming the same are not described in detail herein.

Referring to FIG. 4, the function layer 152 is located between the resistance switching layer 114 and the top electrode structure 116. The function layer 152 may be conformally formed in the opening 125 after the resistance switching layer 114 shown in FIG. 1D is formed and before the top electrode structure 116 is formed. The function layer 152 mads be an oxygen ion reservoir layer, a barrier layer, or a combination thereof. In some embodiments, the function layer 152 is an oxygen ion reservoir layer and can be used to store oxygen ions from the resistance switching layer 114. The material of the oxygen ion reservoir layer may include titanium, tantalum, titanium nitride, tantalum nitride, other suitable conductive materials, or a combination thereof. In some embodiments, the function layer 152 is a barrier layer can be used to block oxygen ions from entering the top electrode structure 116. The material of the barrier layer may include, for example, aluminum oxide ($Al_2O_3$), silicon dioxide ($SiO_2$), hafnium dioxide ($HfO_2$), or titanium oxynitride (TiON). In some embodiments, the function layer 152 is a dual-layer structure formed by an oxygen ion reservoir layer and a barrier layer.

Figure 5:
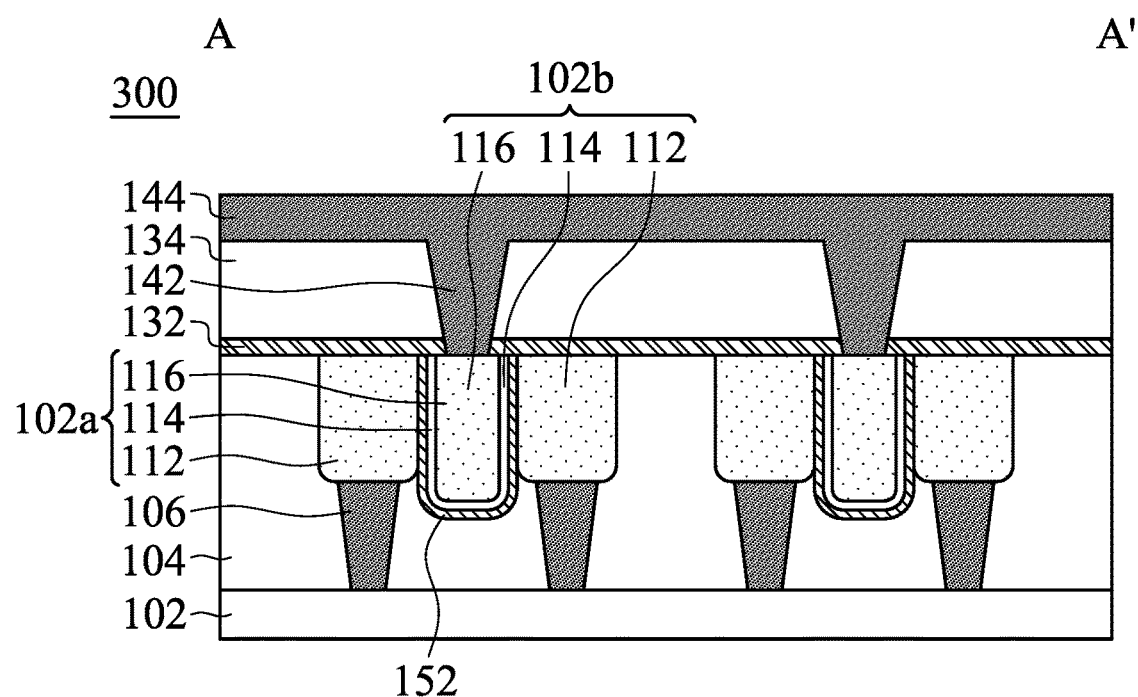
FIG. 5 is a cross-sectional view of a RRAM in accordance with other embodiments.

FIG. 5 is a cross-sectional view of a RRAM 300 in accordance with some embodiments. The RRAM 300 shown in FIG. 5 is similar to the RRAM 200 shown in FIG. 4, and the difference is that the position of the function layer 152 shown in FIG. 5 is different. In order to simplify the description, the elements similar to those shown in FIG. 1E and FIG. 4 and the steps for forming the same are not described in detail herein.

Referring to FIG. 5, the function layer 152 is located between the resistance switching layer 114 and the first dielectric layer 104. The function layer 152 may be conformally formed in the opening 125 after the opening 125 shown in FIG. 1C is formed and before the resistance switching layer 114 shown in FIG. 1D is formed. The function layer 152 may be an oxygen ion reservoir layer, a barrier layer, or a combination thereof. The functions and materials of the oxygen ion reservoir layer and the barrier layer are not described in detail herein.

Figure 6:
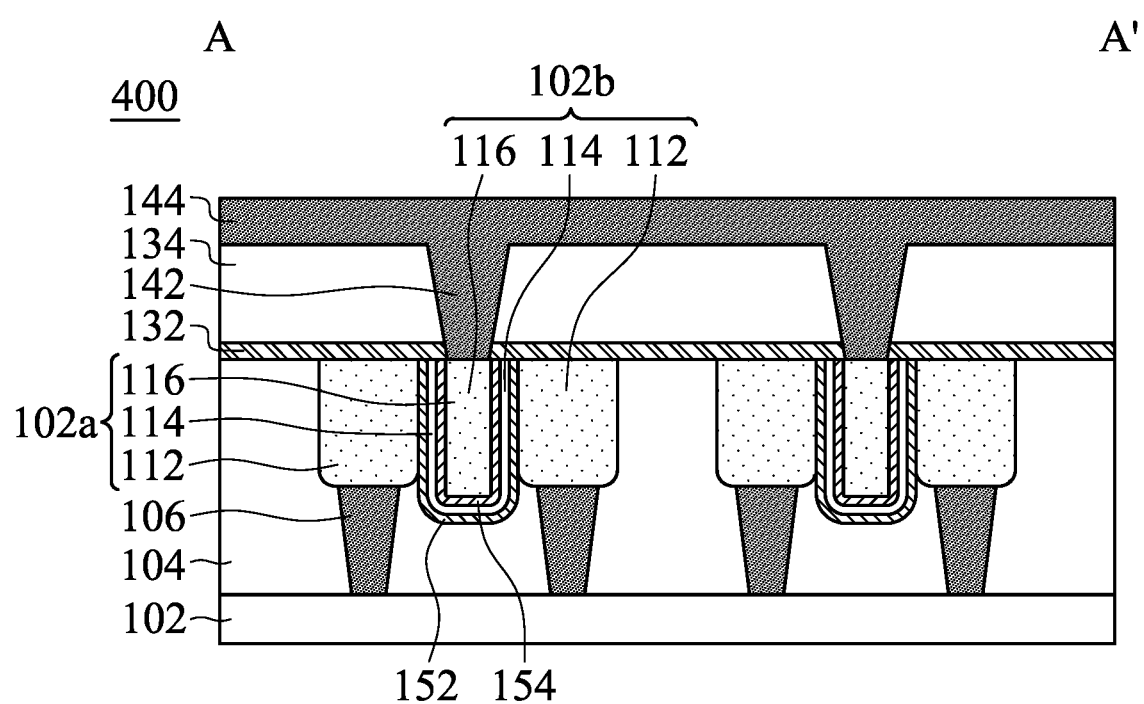
FIG. 6 is a cross-sectional view of a RRAM in accordance with other embodiments.

FIG. 6 is a cross-sectional view of a RRAM 400 in accordance with some embodiments. The MANI 400 shown in FIG. 6 is similar to the RRAM 200 shown in FIG. 4 the RRAM 100 shown in FIG. 1E, and the difference is that an additional first function layer 152 and an additional second function layer 154 are shown in FIG. 6. In order to simplify the description, the elements similar to those shown in FIG. 1E and the steps for forming the same are not described in detail herein.

Referring to FIG. 6, the first function layer 152 is located between the resistance switching layer 114 and the first dielectric layer 104, and the second function layer 154 is located between the resistance switching layer 114 and the top electrode structure 116. The first function layer 152, the resistance switching layer 114, and the second function layer 154 may be sequentially and conformity formed in the opening 125 after the opening 125 shown in FIG. 1C is formed. The first function layer 152 and second function layer 154 may independently be an oxygen ion reservoir layer, a barrier layer, or a combination thereof. The functions and materials of the oxygen ion reservoir layer and the harrier layer are not described in detail herein.

In summary, in the manufacturing method of the RRAM provided by the embodiments of the present invention, a dry etching process is not performed on resistance switching layer. Therefore, damage to the resistance switching layer can be significantly reduced. As a result, the reliability and yield of the RRAM can be significantly improved. Furthermore, in the RRAM provided by the embodiments of the present invention, the memory cells are horizontal memory cells, and two memory cells separated from each other share the same top electrode. Therefore, the density of the memory cells can be significantly increased. As a result, it is advantageous for the miniaturization of the RRAM.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:
1. A RRAM, comprising:
   a first dielectric layer formed on a substrate; and
   two memory cells, comprising:

two bottom electrode structures separated from each other, wherein each of the bottom electrode structures fills one of two trenches located in the first dielectric layer;

a resistance switching layer conformally formed on a surface of an opening located in the first dielectric layer, wherein the opening is located between the two trenches; and a top electrode structure located on the resistance switching layer and filling the opening, wherein a top surface of the first dielectric layer, top surfaces of the bottom electrode structures, a top surface of the resistance switching layer, and a top surface of the top electrode structure are substantially coplanar.

2. The RRAM as claimed in claim 1, wherein the trench has a first depth D1, the opening has a second depth D2, and the second depth D2 is greater than the first depth D1.

3. The RRAM as claimed in claim 2, wherein a ratio D2/D1 of the second depth D2 to the first depth D1 is 1.1-2.0.

4. The RRAM as claimed in claim 1, wherein a bottom surface of each of the bottom electrode structures is higher than or level with a bottom surface of the top electrode structure.

5. The RRAM as claimed in claim 1, wherein the trench has a first width W1 and a first depth D1, and a ratio D1/W1 of the first depth D1 to the first width W1 is 1-10.

6. The RRAM as claimed in claim 1, further comprising:
a second dielectric layer covering the bottom electrode structures, the resistance switching layer, and the top electrode structure;
two bottom electrode contact structures, wherein each of the bottom electrode contact structures is located in the first dielectric layer and between the substrate and each of the bottom electrode structures, and wherein each of the bottom electrode contact structures is electrically connected to one of the bottom electrode structures; and a top electrode contact structure located in the second dielectric layer and on the top electrode structure, wherein the top electrode contact structure is electrically connected to the top electrode structure, and wherein an orthographic projection of the top electrode contact structure on the substrate and an orthographic projection of each of the bottom electrode contact structures on the substrate do not overlap.

7. The RRAM as claimed in claim 1, further comprising:
a protective layer located between the first dielectric layer and the second dielectric layer; and
a conductive line formed on the second dielectric layer and electrically connected to the top electrode contact structure.

8. The RRAM as claimed in claim 1, further comprising:
a function layer conformally formed in the opening and located between the resistance switching layer and the top electrode structure, wherein the function layer is an oxygen ion reservoir layer, a barrier layer, or a combination thereof.

9. The RRAM as claimed in claim 1, further comprising:
a function layer conformally formed in the opening and located between the resistance switching layer and the first dielectric layer, wherein the function layer is an oxygen ion reservoir layer, a barrier layer, or a combination thereof.

10. The RRAM as claimed in claim 1, further comprising:
a first function layer conformally formed in the opening and located between the resistance switching layer and the first dielectric layer; and
a second function layer conformally formed in the opening and located between the resistance switching layer and the top electrode structure, wherein the first function layer and the second function layer is each independently an oxygen ion reservoir layer, a barrier layer, or a combination thereof.

* * * * *